United States Patent [19]
Bottomley

[11] Patent Number: 6,064,203
[45] Date of Patent: May 16, 2000

[54] METHOD AND APPARATUS FOR DETERMINING OR IMAGING LONGITUDINAL SPIN RELAXATION TIME OR PRODUCING IMAGES WHICH SUBSTANTIALLY REFLECT LONGITUDINAL SPIN RELAXATION TIME CONTRAST

[75] Inventor: Paul A. Bottomley, Columbia, Md.

[73] Assignee: The Johns Hopkins University, Baltimore, Md.

[21] Appl. No.: 08/861,297

[22] Filed: May 20, 1997

[51] Int. Cl.$^7$ ..................................................... G01V 3/00
[52] U.S. Cl. ............................................ 324/309; 324/307
[58] Field of Search .................................... 324/307, 309, 324/312, 314, 318, 322

[56] References Cited

U.S. PATENT DOCUMENTS

| | | | |
|---|---|---|---|
| 4,654,595 | 3/1987 | Sepponen | 324/309 |
| 4,698,593 | 10/1987 | Crooks | 324/309 |
| 4,733,186 | 3/1988 | Oppelt et al. | 324/309 |
| 4,982,161 | 1/1991 | Twieg | 324/309 |
| 4,983,921 | 1/1991 | Kramer et al. | 324/309 |
| 5,202,632 | 4/1993 | Kaufman et al. | 324/309 |
| 5,239,266 | 8/1993 | Kaufman et al. | 324/309 |
| 5,245,282 | 9/1993 | Mugler, III et al. | 324/309 |
| 5,281,913 | 1/1994 | Kaufman et al. | 324/309 |
| 5,307,015 | 4/1994 | Kaufman et al. | 324/309 |
| 5,311,133 | 5/1994 | Dannels | 324/309 |
| 5,347,218 | 9/1994 | Van Yperen | 324/309 |
| 5,363,042 | 11/1994 | Dumoulin | 324/306 |
| 5,387,866 | 2/1995 | Dumoulin | 324/309 |
| 5,751,145 | 5/1998 | Shimizu | 324/309 |

FOREIGN PATENT DOCUMENTS 0184840 6/1986 European Pat. Off. ....... G01N 24/08

OTHER PUBLICATIONS

Fram, E.K., et al., "Rapid Calculation of T1 Using Variable Flip Angle Gradient Refocused Imaging," *Magnetic Resonance Imaging*, vol. 5, pp. 201–208, 1987.

Bottomley, P. A. et al., "A review of normal tissue hydrogen NMR relaxation times and relaxation mechanisms from 1–100 MHz: Dependence on tissue type, NMR frequency, temperature, species, excision, and age," *Med. Phys.*, 1984, vol. 11, pp. 425–448.

Bottomley, P. A. et al., "A review of $^1$H nuclear magnetic resonance relaxation in pathology: Are $T_1$ and $T_2$ diagnostic?," *Med. Phys.*, 1987, vol. 14, pp. 1–37.

(List continued on next page.)

*Primary Examiner*—Louis Arana
*Attorney, Agent, or Firm*—Kirk D. Houser; Arnold B. Silverman; Eckert Seamans Cherin & Mellott, LLC

[57] ABSTRACT

The invention provides a method of determining longitudinal spin relaxation time or imaging longitudinal spin relaxation time or producing images which substantially reflect longitudinal spin relaxation time contrast. The method includes establishing a main magnetic field with respect to a specimen and employing a plurality of magnetic resonance (MR) gradients to spatially encode magnetic resonance signals from at least one position within the specimen. A plurality of pairs of pulses including a first radio frequency (RF) pulse having a first predetermined flip-angle and second RF pulse having a second predetermined flip-angle, which is different from the first predetermined flip-angle, are employed. One of the first RF pulses is applied to the specimen to produce a corresponding first MR signal and first MR information is acquired from the first MR signal corresponding to the first RF pulse. The first MR signal is dephased and one of the second RF pulses is applied to the specimen to produce a corresponding second MR signal. Second MR information is acquired from the second MR signal corresponding to the second RF pulse and the first and second MR information is delivered to a processor. The processor determines a ratio from the first and second MR information and determines the longitudinal spin relaxation time from the ratio. Associated apparatus is also disclosed.

54 Claims, 8 Drawing Sheets

OTHER PUBLICATIONS

Vold, R. L. et al., "Measurement of Spin Relaxation in Complex Systems," *J. Chem. Phys.*, 1968, vol. 48, pp. 3831–3832.

Edelstein, W. A. et al., "Spin warp NMR imaging and applications to human whole–body imaging," *J. Phys. Med. Biol.*, 1980, vol. 25, p. 751–56.

Young, I. R. et al., "Initial Clinical Evaluation of a Whole Body Nuclear Magnetic Resonance (NMR) Tomograph," *J. Comp. Assist. Tomogr.*, 1982, vol. 6, pp. 1–18.

Freeman, R. et al., "Fourier Transform Study of NMR Spin–Lattice Relaxation by 'Progressive Saturation'," *J. Chem. Phys.*, 1971, vol. 54, No. 8, pp. 3367–3377.

Edelstein, W. A. et al., "Signal, Noise, and Contrast in Nuclear Magnetic Resonance (NMR) Imaging," *JCAT*, 1983, vol. 7, pp. 391–401.

Canet, D. et al., "Superfast $T_1$ Determination by Inversion–Recovery," *J. Magn. Reson.*, 1988, vol. 77, pp. 483–490.

Bottomley, P. A. et al., "The Dual–Angle Method for Fast, Sensitive $T_1$ Measurement in Vivo with Low–Angle Adiabatic Pulses," *J. Magn. Reson. B.*, 1994, vol. 104, pp. 159–167.

Bottomley, P. A. et al., "BIRP, an Improved Implementation of Low–Angle Adiabatic (BIR–4) Excitation Pulses," *J. Magn. Reson. A.*, 1993, vol. 103, pp. 242–244.

Edelman, R. R. et al., "Contrast–enhanced Echo–planar MR Imaging of Myocardial Perfusion: Preliminary Study in Humans," *Radiol.*, 1994, vol. 190, pp. 771–777.

Manning, W. J. et al., "First–Pass Nuclear Magnetic Resonance Imaging Studies Using Gadolinium–DTPA in Patients With Coronary Artery Disease," *J. Am. Coll. Cardiol.*, 1991, vol. 18, No. 4, pp. 959–965.

Kwong, K. K. et al., "Dynamic magnetic resonance imaging of human brain activity during primary sensory stimulation," *Proc. Natl. Acad. Sci. USA*, 1992, vol. 89, pp. 5675–5679.

Nekolla, S. et al., "T1 Maps by K–Space Reduced Snapshot—FLASH MRI," *J. Comp. Assist. Tomogr.*, 1992, vol. 16(2), pp. 327–332.

Hardy, C.J. et al., "Calculated $T_1$ Images Derived From A Partial Saturation–Inversion Recovery Pulse Sequences With Adiabatic Fast Passage," *J. Magn. Reson.*, 1985, vol. 3, pp. 107–116.

Garwood, M. et al., "Symmetric Pulses to Induce Arbitrary Flip Angles with Compensation for RF Inhomogeneity and Resonance Offsets," *J. Magn. Reson. A.*, 1991, vol. 94, pp. 511–525.

METHOD AND APPARATUS FOR DETERMINING OR IMAGING LONGITUDINAL SPIN RELAXATION TIME OR PRODUCING IMAGES WHICH SUBSTANTIALLY REFLECT LONGITUDINAL SPIN RELAXATION TIME CONTRAST

BACKGROUND OF THE INVENTION

1. Field of the Invention

The present invention relates to an improved method for magnetic resonance spectroscopy or imaging and, more specifically, it relates to a method for determining longitudinal spin relaxation time or imaging longitudinal spin relaxation time or producing images which substantially reflect longitudinal spin relaxation time contrast and, most specifically, it is particularly advantageous in determining changes in the longitudinal spin relaxation times in a patient. The invention also relates to an improved magnetic resonance spectroscopy or imaging apparatus and, more specifically, it relates to such an apparatus for determining longitudinal spin relaxation time or imaging longitudinal spin relaxation time or producing images which substantially reflect longitudinal spin relaxation time contrast.

2. Description of the Prior Art

The determination of spin-lattice relaxation times is a useful procedure in the fields of both high-resolution Magnetic Resonance (MR) spectroscopy and in Magnetic Resonance Imaging (MRI). In these procedures, a specimen is placed in a magnetic field causing resonating nuclei of the specimen, or "nuclear spins", to generate longitudinal spin magnetization. In a common procedure, this magnetization is inverted by the application of a radio frequency (RF) pulse to the specimen capable of nutating the longitudinal spin magnetization by 180°. When the magnetization of the specimen's nuclear spins is inverted, it spontaneously returns to the non-inverted equilibrium state. The return to the equilibrium state occurs in substantially exponential fashion having a time constant which is characteristic of the molecular environment of the nuclear spin. This time constant is conventionally given the name longitudinal spin relaxation time, $T_1$.

During the return to the equilibrium (or fully relaxed) state, the longitudinal magnetization cannot be directly detected. The instantaneous amount of longitudinal magnetization can be measured, however, by applying a sampling RF pulse. This sampling RF pulse nutates the longitudinal magnetization into the transverse plane, thereby creating transverse spin magnetization. Maximum transverse spin magnetization following inversion is generated by the application of a 90° nutation. Unlike longitudinal magnetization, transverse spin magnetization is capable of inducing a signal in a receiver coil placed near the specimen.

The signal induced in the receiver coil carries significant information about the local environment of signal generating nuclei. If the signal is acquired in a homogeneous magnetic field, then the spectral components of the signal can be resolved to provide a MR spectrum in which different peaks arise from populations of nuclei in different molecules (or parts of a molecule). The $T_1$ of individual peaks can vary considerably across a spectrum and can provide useful analytical information about molecular structure.

If the spatial distribution of transverse spin magnetization is to be measured (as in MRI), then the phase of the transverse spin magnetization can be varied as a function of position using magnetic field gradient pulses of selected intensities and durations. This gradient-induced phase variation encodes the location of the induced spin magnetization within the magnetic field. Two or three-dimensional images of the distribution of spin magnetization can be generated by repeating the sequence of RF and magnetic field gradient pulses with a series of different gradient intensities, acquiring the MR signals thereby generated, and applying the appropriate mathematical reconstruction techniques such as multi-dimensional Fourier Transform (FT) or back-projection algorithms, or the like.

Determination of $T_1$ with previously available methods in MR spectroscopy and MRI typically requires a long sequence time. This is because the longitudinal magnetization must be measured at multiple points in time after the inversion pulse to accurately determine the time-constant of the recovery, and because only a single sampling pulse can be used during each recovery process. This is because the application of a sampling pulse disturbs the longitudinal spin magnetization and, hence, compromises the integrity of measurements generated by any subsequent sampling pulses. Therefore, best results are obtained when full recovery of longitudinal spin magnetization occurs after each sampling pulse.

For in vivo applications, the time for full relaxation is typically between 1 and 5 s, since most in vivo $T_1$ values are between 300 and 1500 ms. Determination of $T_1$ for each pixel in an image could require examination times as long as an hour or more, since enough data must be acquired to construct an image or set of images (e.g., with a resolution of 256×256), for each of several sampling times (e.g., 4–8) after each inversion pulse.

$T_1$ is a fundamental MR parameter which characterizes the time taken for nuclear spins to align with the main magnetic field. The value of $T_1$ depends critically on the amount of molecular level motion present at the MR frequency, and is a key determinant of contrast in MR images. See, generally, Bottomley, P. A. et al., "A review of normal tissue hydrogen NMR relaxation times and relaxation mechanisms from 1–100 MHz: Dependence on tissue type, NMR frequency, temperature, species, excision, and age," *Med. Phys.* 1984, Vol. 11, pp. 425–48; and Bottomley, P. A. et al., "A review of $^1$H nuclear magnetic resonance relaxation in pathology: Are $T_1$ and $T_2$ "diagnostic?" *Med. Phys.* 1987, Vol. 14, pp. 1–37.

While MR image intensity is dependent on $T_1$, $T_1$ images (i.e., images whose intensity is directly proportional to $T_1$) are rarely used in medical MR because conventional methods of $T_1$ imaging are too time-consuming, and because of the poor specificity of $T_1$ as a diagnostic indicator, which makes them no more useful than images whose signal is proportional to the MR signal.

A conventional method of measuring $T_1$ is to apply an RF inversion (180°) pulse followed by a delay period, $T_1$, and then to apply a read-out (90°) RF pulse. See Vold, R. L. et al., *J. Chem. Phys.* 1968, Vol. 48, p. 3831.

This sequence is repeated at intervals $T_R \gg T_1$ for a series of different $T_1$ values. The resultant signals are fitted to an exponential whose time constant is $1/T_1$. When applied to MR imaging, the read-out pulse is replaced by an MR imaging sequence. See Edelstein, W. A. et al., *J. Phys. Med. Biol.* 1980, Vol. 25, pp. 51–56.

Hence, multiple images must be acquired for many different $T_1$ values and a $T_1$ image can only be constructed after fitting an exponential to the MR signals in each picture element (i.e., pixel) of the image, determining the time-constants, and displaying them proportional to image intensity. This method is extremely time-consuming because of the delay caused by the $T_R \gg T_1$ condition, which applies to acquisition of each "frame" of an image, and which is generally impractical for medical applications. Nevertheless, acquisition of an image preceded by an inversion pulse at $T_1$ remains a useful method of enhancing contrast due to differences in $T_1$. See Young, I. R. et al., "Initial Clinical Evaluation of a Whole Body Nuclear Magnetic Resonance (NMR) Tomograph," *J. Comp. Assist. Tomogr.* 1982, Vol. 6, pp. 1–18.

U.S. Pat. No. 5,387,866 discloses the inversion recovery method of measuring $T_1$, involving application of a 180° inversion pulse followed by detection or read-out pulses that are selective for different slices in a specimen. The detection pulses are offset in frequency to select different regions in the specimen, and the flip-angles of the pulses are the same.

U.S. Pat. No. 5,363,042 similarly discloses the use of the inversion recovery sequence and employs gradient pulses to measure $T_1$ in conjunction with blood flow measurements.

U.S. Pat. No. 4,733,186 discloses the inversion recovery method generally including an inversion pulse and plural RF read-out pulses in the range 5°–20° to slightly change the longitudinal magnetization. The RF read-out pulses all have the same flip-angle.

$T_1$ can also be measured by the partial saturation sequence wherein RF pulses (e.g., 90° pulses) are applied at period $T_R \leq T_1$ until the MR signal reaches a steady-state value. See Freeman, R. et al., *J. Chem. Phys.* 1971, Vol. 54, p. 3367. $T_1$ is calculated by fitting the MR signal strengths measured for a number of different $T_R$ values to an exponential with time-constant $T_R/T_1$. Again, this is rarely used for imaging $T_1$ because it requires image acquisitions to be repeated for many (e.g., >2) $T_R$ values with steady-state equilibrium being established prior to commencement of each acquisition. The method is used, however, for providing $T_1$-dependent image contrast with a carefully selected $T_R$ value.

Sequences of alternating 90° and 180° pulses applied with $T_R < 5T_1$ can also be used to provide $T_1$ contrast in images, and to measure $T_1$ in shorter scan times than in the inversion recovery method. In this case, $T_1$ is calculated from the two signals, S1 and S2, in a "SUFIR" sequence: "90°-t-180°-t-90°(acquire S1)-t-180°-t-90°(acquire S2)." Time t is set between $0.5T_1$ and $3T_1$, but the spacing between applications of the complete sequences, for averaging (or imaging) purposes, for example, must allow for complete relaxation. While a $T_1$ measurement is theoretically possible from a single "SUFIR" sequence application, images of $T_1$ would take much longer if S1 and S2 correspond to each frame of an image, requiring repeated applications to build an entire MR image. See, generally, Edelstein, W. A. et al., JCAT 1983, Vol. 7, pp. 391–401; and Canet, D. et al., "Superfast $T_1$ Determination by Inversion-Recovery," *J. Magn. Reson.* 1988, Vol. 77, pp. 483–90.

In addition, the "SUFIR" sequence does not yield optimum efficiency since MR signals are acquired for every five pulses that are applied and because the two 180° pulses generate no MR signals.

Another approach is the dual angle method which is comprised of two sequences of pulses of flip-angles <90° (e.g., 15°, 60°) applied with a constant period $T_R \leq T_1$. See Bottomley, P. A. et al., "The Dual-Angle Method for Fast, Sensitive $T_1$ Measurement in Vivo with Low-Angle Adiabatic Pulses," *J. Magn. Reson. B.* 1994, Vol. 104, pp. 159–67. A series of first (e.g., 15°) pulses are applied until steady-state equilibrium is established, then MR signals are acquired following every pulse. Next, a series of second pulses (e.g., 60°) are applied and signals again are acquired at steady-state. $T_1$ is calculated from the ratio of the two signals. Unlike the SUFIR method, the dual angle method is more efficient when much signal averaging or imaging is required since the extra data can be acquired simply by adding acquisitions once steady-state conditions are established. However, the method still requires two separate acquisition sequences, and two establishments of steady-state equilibrium.

The dual angle method takes advantage of low-angle adiabatic "BIRP" pulses which can be set highly accurately without the need for lengthy pulse calibration procedures. The flip-angles can be dialed up and are correctly set to within about ±1° over a wide range of transmitter power levels and MR RF field inhomogeneity. See Bottomley, P. A. et al., "BIRP, an Improved Implementation of Low-Angle Adiabatic (BIR-4) Excitation Pulses," *J. Magn. Reson. A.* 1993, Vol. 103, pp. 242–44.

U.S. Pat. No. 5,347,218 discloses spin-echo MRI in a conventional manner, with short sequence repetition times, in which an approximately 90° RF pulse is followed by a substantially 180° RF pulse to detect a spin-echo at time 2τ.

U.S. Pat. Nos. 5,202,632 and 5,239,266 disclose an MRI sequence for producing images with improved $T_1$ contrast or $T_2$ (i.e., transverse relaxation time) contrast. A θ° (e.g., 90°) excitation pulse is followed by one or more 180° refocusing pulses. To enhance contrast and the signal-to-noise ratio of relatively long $T_1$ tissues for relatively low spatial frequency encoded sub-sequences, the initial angle θ is reduced for the lower spatial frequencies.

U.S. Pat. Nos. 5,281,913 and 5,307,015 disclose an apparatus and methods of measuring $T_1$ at different magnetic field strengths by soaking a specimen in a different magnetic field followed by a $T_1$ measurement in the main magnetic field of an MR system.

In U.S. Pat. No. 5,281,913, $T_1$ is measured by repeating two MR spin echo sequences with two different $T_R$ values. A 90° pulse may be applied prior to switching the magnetic field.

In U.S. Pat. No. 5,307,015, a pulse of flip-angle α° is applied, the magnetic field is switched to a new value for some time τ and, then, is switched back to the main magnetic field, after which the MRI experiment is completed. This is repeated for a plurality of α values. To speed up the process, a short $T_R$ is employed and the steady-state, incompletely relaxed, magnetization is measured in a separate experiment. For each $T_1$ relaxation measurement, at least three MRI sequences are applied.

U.S. Pat. No. 5,245,282 discloses a $T_1$ contrast enhancing sequence involving the use of a single $T_1$ preparation pulse, such as a ≤180° pulse, followed by a delay period, and application of a conventional gradient echo or other imaging sequence. A 180° inversion pulse is followed by a sequence of 128 10° pulses. In U.S. Pat. No. 5,245,282, it is disclosed to vary the flip-angle as a function of a phase-encoding step and is claimed to provide variable flip-angles in conjunction with a pulse sequence comprised of a magnetization preparation period, a data acquisition period, a magnetization recovery period to allow relaxation before application of the next cycle, and repetition of these steps to cover the image k-space.

U.S. Pat. No. 5,311,133 discloses a pulse sequence for performing rapid MRI with sequence spacing $T_R < T_2$, the transverse relaxation time. The RF excitation pulses applied in this sequence have the same flip-angle which is preferably less than 20°.

A deficiency in known methods for determining $T_1$ is the requirement to establish equilibrium or steady-state conditions on multiple occasions. For imaging acquisitions, they require multiple sequence applications. This makes them unsuitable for determining $T_1$ changes in dynamic functional MR studies, such as in the heart or in the brain, and for minimally invasive MR therapy studies, for example, employing hyper/hypothermy in cancerous tissue. See, generally, Edelman, R. R. et al., *Radiol.* 1994, Vol. 190, pp. 771–77; Manning, W. J. et al., "First-Pass Nuclear Magnetic Resonance Imaging Studies Using Gadolinium-DTPA in Patients With Coronary Artery Disease," *J. Am. Coll. Cardiol.* 1991, Vol. 18, pp. 959–65; and Kwong, K. K. et al., "Dynamic magnetic resonance imaging of human brain activity during ring primary sensory stimulation," *Proc. Natl. Acad. Sci. USA* 1992, Vol. 89, pp. 5675–79.

As $T_1$ changes are believed to be the prime mechanism for the changing contrast responsible for the functional changes which are manifest as changes in image contrast, further improvements to expedite the acquisition of $T_1$ information are extremely desirable.

For these reasons, there remains a very real and substantial need for an improved apparatus and method of operation thereof for determining or imaging longitudinal spin relaxation time or producing images which substantially reflect longitudinal spin relaxation time contrast.

SUMMARY OF THE INVENTION

The present invention has met this need by providing an improved method of determining longitudinal spin relaxation time. This method includes establishing a main magnetic field with respect to a specimen; employing a first radio frequency pulse having a first predetermined flip-angle; employing a second radio frequency pulse having a second predetermined flip-angle which is different from the first predetermined flip-angle; applying the first radio frequency pulse to the specimen to produce a first magnetic resonance signal; acquiring first magnetic resonance information from the first magnetic resonance signal corresponding to the first radio frequency pulse; dephasing the first magnetic resonance signal; applying the second radio frequency pulse to the specimen to produce a second magnetic resonance signal; acquiring second magnetic resonance information from the second magnetic resonance signal corresponding to the second radio frequency pulse; determining a ratio from the first and second magnetic resonance information; and determining the longitudinal spin relaxation time from the ratio.

A preferred refinement includes employing a gradient pulse to dephase the first magnetic resonance signal. Another preferred refinement includes employing a plurality of first radio frequency pulses and a plurality of second radio frequency pulses. Preferably, an alternating sequence of first and second radio frequency pulses is employed. Steady-state equilibrium is preferably established by employing the alternating sequence of the first and second radio frequency pulses prior to the steps of determining the ratio and determining the longitudinal spin relaxation time.

The invention also provides an improved method of imaging longitudinal spin relaxation time. The method includes establishing a main magnetic field with respect to a specimen; employing a plurality of magnetic resonance gradients to cause magnetic resonance signals at at least one position within the specimen to become spatially encoded; employing a first radio frequency pulse having a first predetermined flip-angle; employing a second radio frequency pulse having a second predetermined flip-angle which is different from the first predetermined flip-angle; applying the first radio frequency pulse to the specimen to produce a first magnetic resonance signal; acquiring first magnetic resonance information from the first magnetic resonance signal corresponding to the first radio frequency pulse; dephasing the first magnetic resonance signal; applying the second radio frequency pulse to the specimen to produce a second magnetic resonance signal; acquiring second magnetic resonance information from the second magnetic resonance signal corresponding to the second radio frequency pulse; delivering the first and second magnetic resonance information to processing means; determining the longitudinal spin relaxation time in the processing means from the first and second magnetic resonance information; determining image information in the processing means on the basis of the longitudinal spin relaxation time corresponding to the position within the specimen; and employing display means for receiving the image information from the processing means and displaying the same as an image.

The invention further provides an improved method of producing images which substantially reflect longitudinal spin relaxation time contrast. The method includes establishing a main magnetic field with respect to a specimen; employing a plurality of magnetic resonance gradients to spatially encode magnetic resonance signals from at least one position within the specimen; employing a first radio frequency pulse having a first predetermined flip-angle; employing a second radio frequency pulse having a second predetermined flip-angle which is different from the first predetermined flip-angle; applying the first radio frequency pulse to the specimen to produce a first magnetic resonance signal; acquiring first magnetic resonance information from the first magnetic resonance signal corresponding to the first radio frequency pulse; dephasing the first magnetic resonance signal; applying the second radio frequency pulse to the specimen to produce a second magnetic resonance signal; acquiring second magnetic resonance information from the second magnetic resonance signal corresponding to the second radio frequency pulse; delivering the first and second magnetic resonance information to processing means; determining a ratio from the first and second magnetic resonance information in the processing means; determining image information in the processing means on the basis of the ratio corresponding to the position within the specimen; and employing display means for receiving the image information from the processing means and displaying the same as an image.

The invention also provides an improved method of determining longitudinal spin relaxation time or imaging longitudinal spin relaxation time or producing images which substantially reflect longitudinal spin relaxation time contrast. The method includes establishing a main magnetic field with respect to a specimen; employing a plurality of magnetic resonance gradients to spatially encode magnetic resonance signals within the specimen; employing a plurality of pairs of pulses including a first radio frequency pulse having a first predetermined flip-angle and a second radio frequency pulse having a second predetermined flip-angle which is different from the first predetermined flip-angle; applying one of the first radio frequency pulses to the specimen to produce a corresponding first magnetic resonance signal; acquiring first magnetic resonance information from the first magnetic resonance signal corresponding to the one of the first radio frequency pulses; dephasing the first magnetic resonance signal; applying one of the second radio frequency pulses to the specimen after the first magnetic resonance signal is dephased to produce a corresponding second magnetic resonance signal; acquiring second magnetic resonance information from the second magnetic resonance signal corresponding to the one of the second radio frequency pulses; delivering the first and second magnetic resonance information to processing means; and determining a ratio from the first and second magnetic resonance information in the processing means.

A preferred refinement includes employing a patient as the specimen, employing the magnetic resonance gradients to define a plurality of positions with the patient, determining a plurality of longitudinal spin relaxation times corresponding to the positions within the patient, and employing changes in the longitudinal spin relaxation times to monitor changes within the patient. Further refinements include monitoring the effects of temperature changes or changes in $O_2$ concentration as at least one of the changes within the patient that are reflected by changes in the relaxation times. Still further refinements include inducing temperature changes within the patient or stimulating the patient with at least one of stress and neurological tests before or during the step of monitoring changes within the patient.

Other refinements include determining image information in the processing means on the basis of the longitudinal spin relaxation time corresponding to the position within the specimen, and employing display means for receiving the image information from the processing means and displaying the same as an image of the longitudinal spin relaxation time.

The invention further provides an improved apparatus for determining longitudinal spin relaxation time or imaging longitudinal spin relaxation time or producing images which substantially reflect longitudinal spin relaxation time contrast. The apparatus comprises means for establishing a main magnetic field with respect to a specimen; means for applying radio frequency pulses to the specimen to produce corresponding magnetic resonance signals; means for dephasing the magnetic resonance signals; means for acquiring magnetic resonance information from the magnetic resonance signals corresponding to the radio frequency pulses; and control means including means for controlling the radio frequency pulses to provide a first radio frequency pulse having a first predetermined flip-angle and a second radio frequency pulse having a second predetermined flip-angle which is different from the first predetermined flip-angle, means for applying a plurality of the first and second radio frequency pulses, with one of the second radio frequency pulses following one of the first radio frequency pulses, and with another one of the first radio frequency pulses following the one of the second radio frequency pulses, means cooperating with the means for dephasing to dephase one of the first and second magnetic resonance signals before a subsequent one of the second and first radio frequency pulses, respectively, is applied, and means for determining at least a ratio from first magnetic resonance information of the magnetic resonance signals corresponding to one of the first radio frequency pulses and second magnetic resonance information of the magnetic resonance signals corresponding to one of the second radio frequency pulses.

A preferred refinement includes providing means for varying the peak amplitude of the first and second radio frequency pulses. Another refinement includes providing means for applying adiabatic BIRP or BIR-4 radio frequency excitation pulses. Another preferred refinement includes providing means for applying first gradient pulses to dephase the first magnetic resonance signals, and means for applying second gradient pulses to dephase the second magnetic resonance signals. A further refinement includes providing means for varying the peak amplitude of the first gradient pulses and the peak amplitude of the second gradient pulses.

It is an object of the present invention to provide a method and apparatus for providing MR and spectroscopic imaging of the interior of specimens, including rapid in vivo and in vitro imaging of patients and patient-derived specimens.

It is a further object of the invention to provide such a method and apparatus which will permit the use of slice selective and three-dimensionally resolved MR imaging.

It is a further object of the invention to provide such a method and apparatus which will permit diagnosis of changes in a patient.

These and other objects of the invention will be more fully understood from the following detailed description of the invention on reference to the illustrations appended hereto.

DESCRIPTION OF THE PREFERRED EMBODIMENTS

As used herein, the term "specimen" shall refer to any object placed in a main magnetic field for determining longitudinal spin relaxation time, imaging longitudinal spin relaxation time, producing other images such as images which substantially reflect longitudinal spin relaxation time contrast, or spectroscopic analysis and shall expressly include, but not be limited to members of the animal kingdom, including humans; test specimens, such as biological tissue, for example, removed from such members of the animal kingdom; and inanimate objects or phantoms which may be imaged by magnetic resonance techniques, or which contain water or sources of other sensitive nuclei.

As used herein, the term "patient" shall mean human beings and other members of the animal kingdom.

As used herein, the term "dephasing" shall expressly include, but not be limited to, causing or waiting for the MR spins that comprise transverse spin magnetization within a region of interest such as, for example, the selected portion of a specimen, to be substantially out-of-phase in order that the net observed transverse magnetization is substantially zero.

Figure 1:
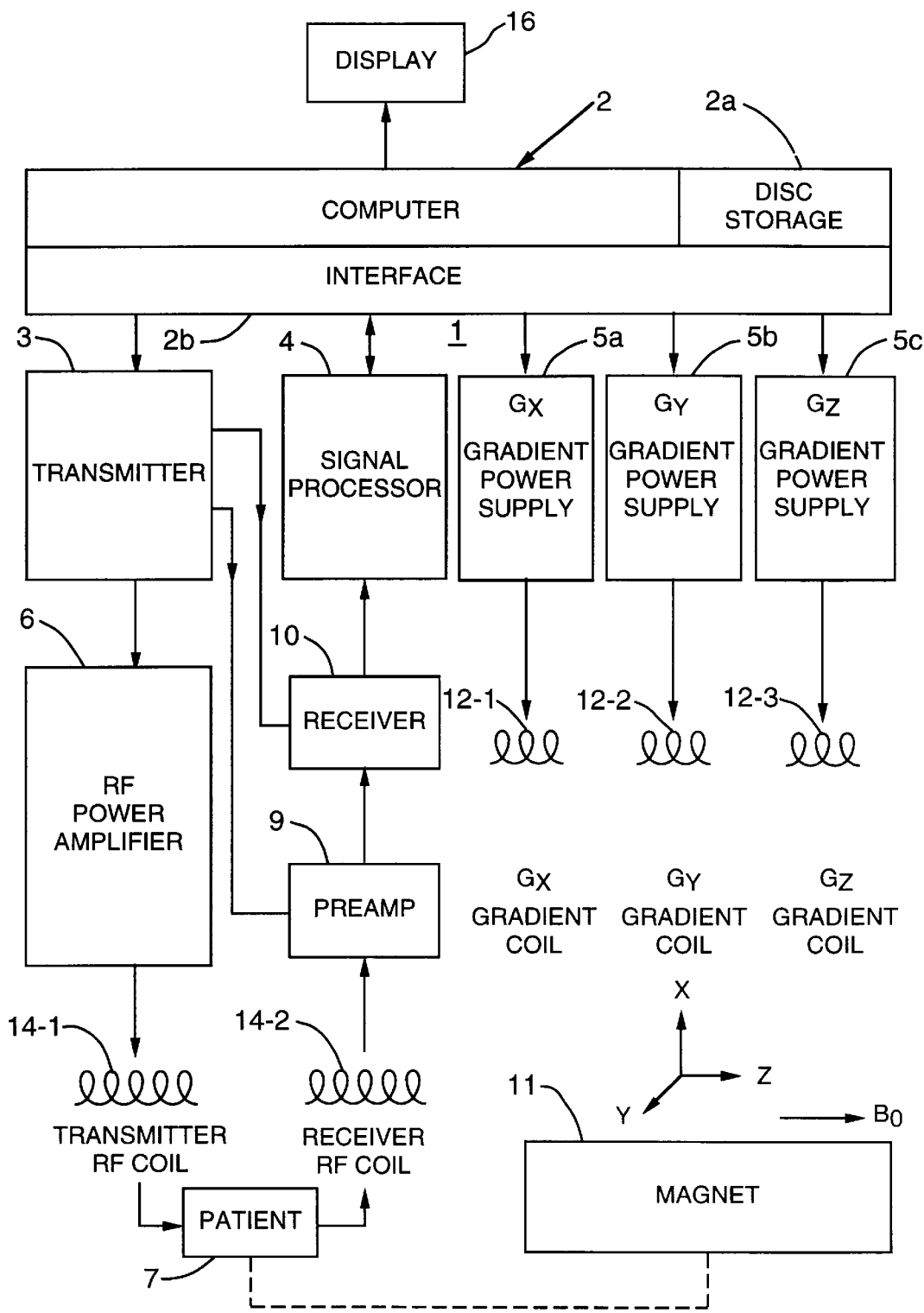
FIG. 1 is a simplified block diagram of a magnetic resonance (MR) imaging system suitable for use with the present invention.

FIG. 1 is a simplified block diagram of the major components of a magnetic resonance (MR) imaging system 1 suitable for use with the invention described herein. The system 1 includes a general purpose mini-computer 2 which is functionally coupled to a disk storage unit 2a and an interface unit 2b. It will be appreciated that while reference has been made to the exemplary mini-computer 2, other processors such as, for example, microcomputers, microprocessors or mainframe computers may be employed.

In the system 1, a radio frequency (RF) transmitter 3, signal processor 4, and gradient power supplies 5a,5b,5c, are all coupled to computer 2 through interface unit 2b. Gradient power supplies 5a,5b,5c energize gradient coils 12-1,12-2, 12-3 to create magnetic field gradients $G_X, G_Y, G_Z$ in the "X","Y","Z" directions, respectively, over a specimen to be imaged, such as a patient 7, disposed in a static main magnetic field $B_0$. RF transmitter 3 is gated with pulse envelopes from computer 2 to generate RF pulses having the required modulation to excite an MR response signal from the specimen. The RF pulses are amplified in an RF power amplifier 6 to various levels (e.g., from about 100 watts to many kilowatts), depending on the imaging method, and applied to a transmitter coil 14-1. Higher power levels, for example, are employed for large specimen volumes, such as in whole body imaging, and where short duration pulses are required to excite larger MR frequency bandwidths. The specimen is generally aligned with the magnetic field $B_0$ and the RF pulses are imposed perpendicular thereto.

The MR response signal is sensed by a receiver coil 14-2, amplified in a low noise preamplifier 9 and passed to receiver 10 for further amplification, detection, and filtering. The signal is then digitized for averaging or other signal sampling by signal processor 4 and for subsequent processing by computer 2. Preamplifier 9 and receiver 10 are protected from the RF pulses during transmission by active gating or by passive filtering.

Computer 2 provides gating and envelope modulation for the RF pulses, blanking for the preamplifier 9 and RF power amplifier 6, and voltage waveforms for the gradient power supplies 5a–5c. Where oblique imaging is employed, the angle of impingement of the vector representing the spatial gradient of the magnetic field will be angularly offset from either the X, Y, or Z directions. This arrangement results in excitation of the nuclei within the area or volume to be imaged and causes responsive emission of magnetic energy which is picked up by preamplifier 9 and receiver 10.

The computer 2 also performs conventional data processing such as Fourier Transformation, image reconstruction, data filtering, imaging display, and storage functions. Within computer 2, the Fourier Transformations of signals convert the plot of amplitude versus time to a map of the distribution of frequencies by plotting amplitude versus frequency. The Fourier Transformations are performed in order to establish the intensity value positions of specific pixels and/or to obtain chemical shift spectra at those positions. These values may be stored, enhanced or otherwise processed, and emerge to be displayed on a suitable screen, such as a cathode-ray tube 16, for example.

Transmitter coil 14-1 and receiver RF coil 14-2, if desired, may comprise a single coil (not shown). Alternatively, two separate coils that are electrically decoupled from each other may be used. The latter configuration has the advantage of reduced RF pulse breakthrough into preamplifier 9 and receiver 10 during pulse transmission. In both cases, the transmitter and receiver coils 14-1,14-2 generate RF magnetic fields that are orthogonal to the direction of the magnetic field $B_0$ produced by a magnetic field generator such as magnet assembly 11. The magnet, patient, and all coils may be isolated from the remainder of the system 1 by enclosure in an RF shielded cage (not shown). Any suitable transmitter and receiver coils known to those skilled in the art may be employed.

Magnetic field gradient coils 12-1,12-2,12-3 provide gradients $G_X, G_Y, G_Z$, respectively, that are preferably monotonic and linear over the specimen volume. Multivalued gradient fields cause a degradation in the MR response signal data, known as aliasing, which leads to severe image artifacts. Nonlinear gradients cause geometric distortions of the image.

Magnet assembly 11 has a central cylindrical bore (shown in FIG. 6) which generates the magnetic field $B_0$, typically in the axial, or Z Cartesian coordinate direction. A set of coils, such as the coils 12-1,12-2,12-3, receive electrical signals and provide at least one gradient magnetic field within the volume of the bore. Also situated within the bore is the RF coil 14-1 (or, alternatively, a single coil for coils 14-1, 14-2), which receives RF energy to provide an RF magnetic field (not shown) typically in the X-Y plane.

The exemplary patient 7 is placed within the magnet assembly 11 of the exemplary MR imaging system 1, although the invention is also applicable to MR spectrometers. A pulse sequence is then applied and the data is analyzed.

Figure 2A:
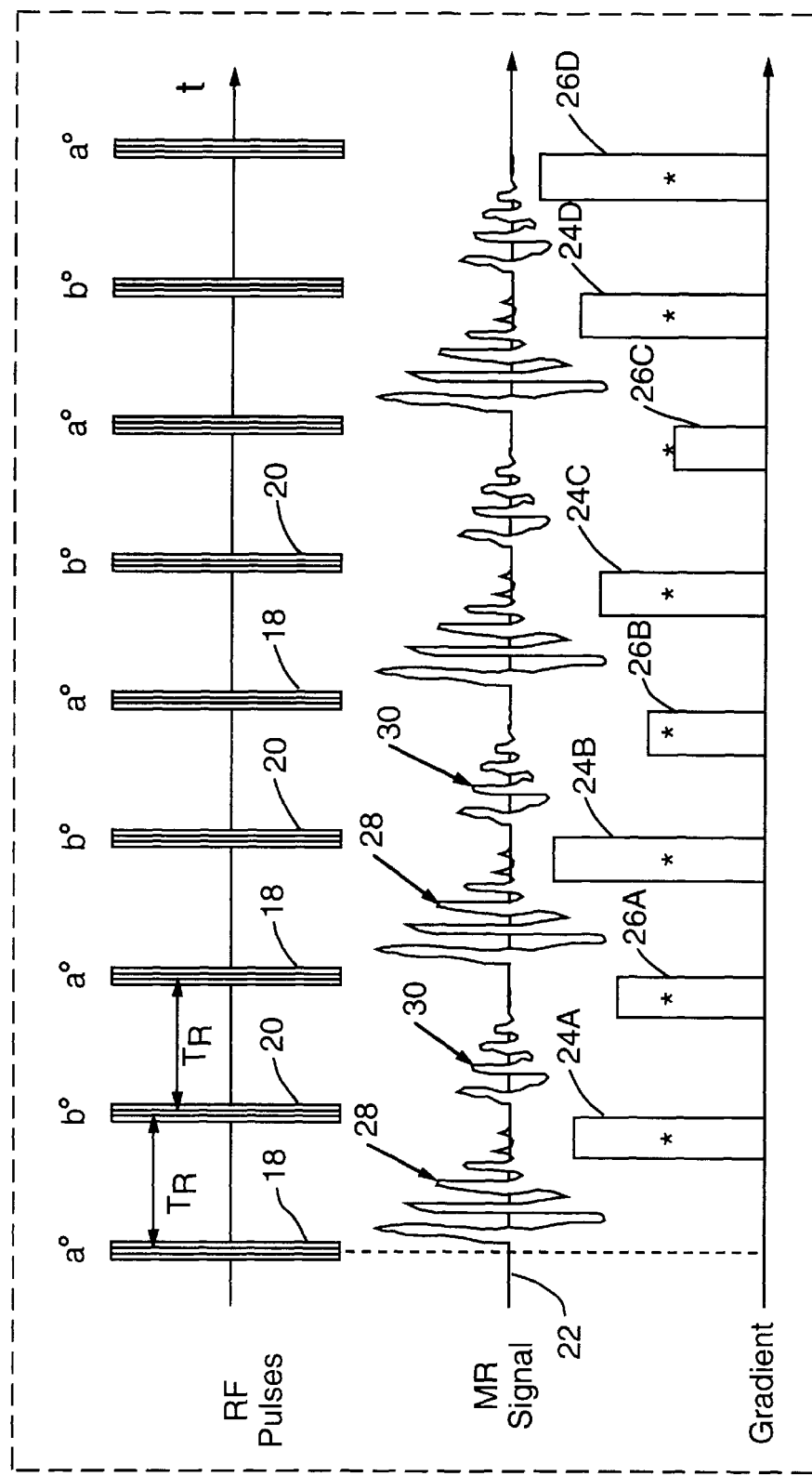
FIG. 2A is a plot of a sequence of radio frequency (RF) pulses having flip-angles a,b; resulting MR signals; and "crusher" gradient pulses.

Referring to FIG. 2A, an exemplary pulse sequence is illustrated for determining longitudinal spin relaxation time $T_1$ with at least two RF pulses 18,20 having respective different predetermined flip-angles a,b. Also referring to FIG. 1, the first RF pulse 18 is applied to the patient 7 to produce a corresponding MR signal 28 and corresponding MR information is acquired by the receiver coil 14-2, preamplifier 9, receiver 10 and signal processor 4 for the computer 2 from the MR signal 28. A time interval $T_R$ is employed between the application of the first RF pulse 18 and the application of the second RF pulse 20, which is applied to the patient 7 to produce a corresponding MR signal 30 and acquire corresponding MR information for the computer 2.

Preferably, a sequence of the RF pulses 18,20 is applied, with the time interval $T_R$ between each pair of the pulses 18,20, until steady-state equilibrium is established (i.e., until the MR signals excited by two consecutive a° pulses 18 are the same or those excited by two consecutive b° pulses 20 are the same). An alternating sequence of the RF pulses 18,20 is employed (e.g., 18,20,18,20 or 20,18,20,18). Preferably, adiabatic pulses, such as BIRP or BIR-4 as understood by those skilled in the art (see, for example, Bottomley, P. A. et al., "BIRP, an Improved Implementation of Low-Angle Adiabatic (BIR-4) Excitation Pulses," *J. Magn. Reson. A.* 1993, Vol. 103, pp. 242–44; and Garwoord, M. et al., *J. Magn. Reson. A.* 1991, Vol. 94, pp. 511–25), may be employed for excitation, thereby eliminating the need for careful calibration of the preselected flip-angles a,b.

The MR signal 22 (i.e., transverse spin magnetization) is allowed to dephase after each acquisition by waiting for a suitable time interval $T_R$ between the application of the RF pulses 18,20. The signal dephasing is suitably accomplished when the time interval $T_R \gg T_2^*$, the inhomogeneously shortened transverse relaxation time. Alternatively, the MR signal 22 may be forcibly dephased by "crusher" (*) gradient pulses 24A,24B,24C,24D and 26A,26B,26C,26D as illustrated in FIG. 2A, in order that the transverse MR signal dephasing is accelerated by the gradient pulses 24A–24D and 26A–26D. For example, the MR signal 28 is dephased by the gradient pulse 24A before the subsequent RF pulse 20 is applied. Similarly, the MR signal 30, which corresponds to such subsequent RF pulse 20, is dephased by the gradient pulse 26A before the next RF pulse 18 is applied. Preferably, for purpose of maximum efficacy of MR signal dephasing, the peak amplitude of the gradient pulses 24A–24D and 26A–26D is varied after each pulse-and-acquire element (e.g., RF pulse 18 and MR signal 28, RF pulse 20 and MR signal 30) of the pulse train.

The MR signals 28,30 are employed by the signal processor 4 and the computer 2 to determine a ratio from MR information corresponding to the signals 28,30 and, then, to determine the longitudinal spin relaxation time $T_1$ from the ratio. This permits $T_1$ to be determined in a single sequence application after steady-state equilibrium is established. The sequence is also amenable to signal averaging and imaging. Once steady-state is reached, as many signals, for purposes of averaging or spatial encoding, may be acquired as desired.

A wide variety of values for the two flip-angles a,b are possible. Preferably, the flip-angles a,b are chosen to optimize the sensitivity of the ratio of the two MR signals to $T_1$ variations, and the signal-to-noise ratio of the measured MR signal 22. Preferably, the flip-angle a of about 5° to 85° and the flip-angle b of about 95° to 175° are employed.

For a pair of angles (a,b), the two steady-state signals are substantially as set forth in Equations 1 and 2, provided that residual transverse magnetization is dephased (e.g., by gradients 24A–24D, 26A–26D) prior to each pulse:

$$S = (1 - EI)\frac{(1 + \cos(a)EI)}{(1 - \cos(a)\cos(b)EI^2)}\sin(b) \qquad \text{Eq. (1)}$$

$$Q = (1 - EI)\frac{(1 + \cos(b)EI)}{(1 - \cos(a)\cos(b)EI^2)}\sin(a) \qquad \text{Eq. (2)}$$

wherein:
S is a first steady-state MR signal (e.g., MR signal 28)
Q is a second steady-state MR signal (e.g., MR signal 30)
EI =exp[<$T_R/T_1$], with exp[x]=$e^x$
a is a first flip-angle
b is a second flip-angle
$T_R$ is repetition time
The ratio R is determined from Equation 3:

$$R = \frac{(1 + \cos(a)EI)\sin(b)}{(1 + \cos(b)EI)\sin(a)} = S/Q \qquad \text{Eq. (3)}$$

The value of $T_1$ is determined from Equation 4 following inversion of Equation 3:

$$T_1 = -T_R/\ln\left(\frac{R\sin(a) - \sin(b)}{\cos(a)\sin(b) - R\cos(b)\sin(a)}\right) \qquad \text{Eq. (4)}$$

The method and apparatus of the invention pertain to various MR systems and provide rapid encoding of longitudinal spin relaxation time $T_1$ information within a single steady-state MR experiment. The information is manifested in the MR signal either as: (1) an enhanced sensitivity of the MR signal to variations in $T_1$ (i.e., $T_1$ contrast) as reflected by the ratio R of Equation 3, or (2) the $T_1$ information may be produced directly by a straight-forward manipulation of the signal amplitudes as determined from Equations 3 and 4.

Figure 3:
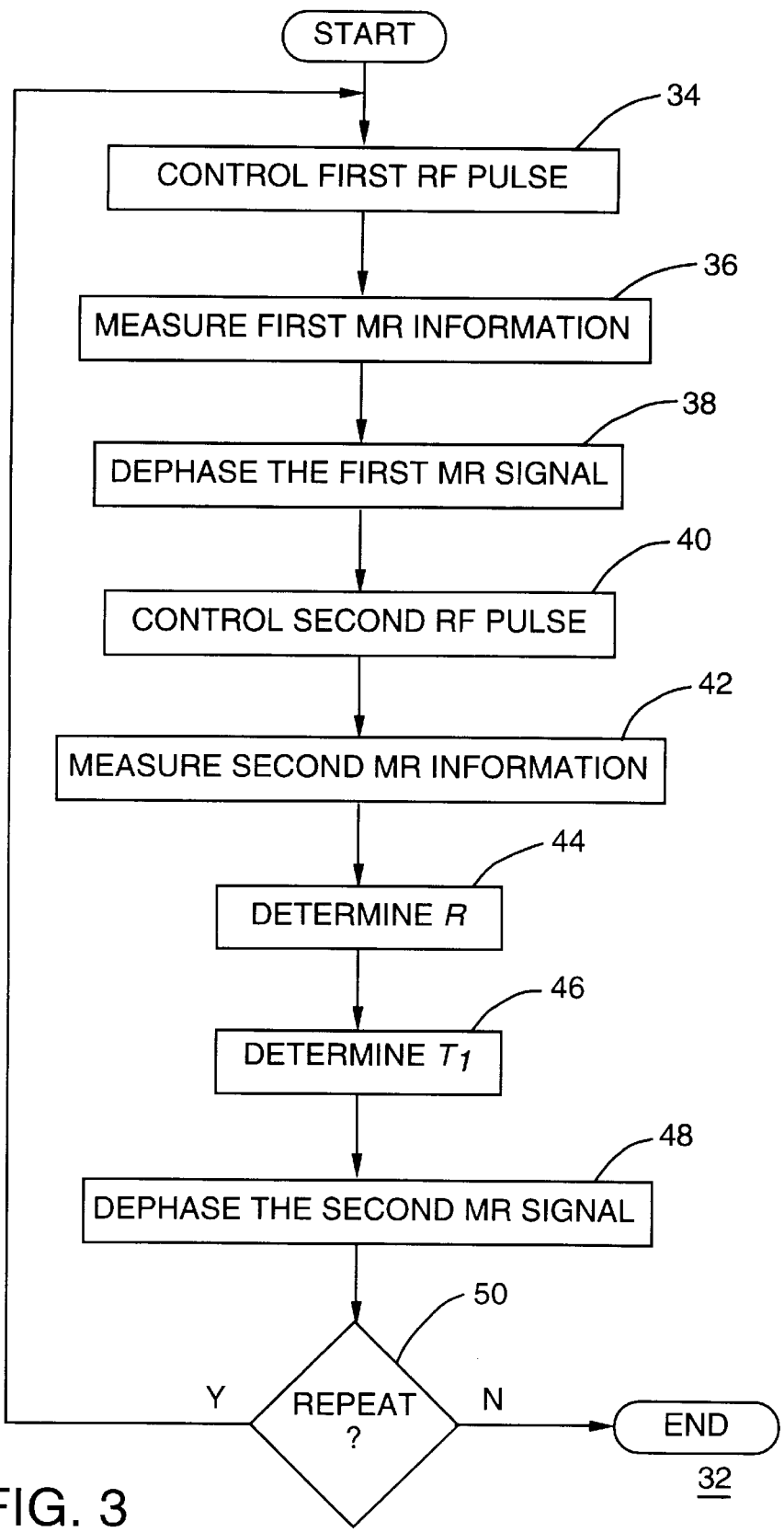
FIG. 3 is a flowchart of a software routine employed by the computer of FIG. 1 to determine longitudinal spin relaxation time $T_1$.

FIG. 3 is a flowchart of a software routine 32 employed by the computer 2 of FIG. 1 to determine longitudinal spin relaxation time $T_1$. Beginning at 34, the computer 2 controls a first RF pulse 18 of FIG. 2A through the interface 2b after steady-state has been established by repeated prior application of the sequence of a and b pulses and dephasing gradients, to provide the first predetermined flip-angle a of suitable peak amplitude. Next, at 36, the signal processor 4 measures a first value S for input by the computer 2 through the interface 2b. The value S is measured from at least a portion of the first MR information corresponding to the MR signal 28 of FIG. 2A. Depending upon the application, the value S corresponds to: (1) a peak value of the first MR information; (2) a value determined at a predetermined time interval after the application of the first RF pulse 18; or (3) a value determined by averaging the first MR information. Then, at 38, the computer 2 provides signals that result in dephasing of the first MR signal 28 before the subsequent RF pulse 20 is applied. Preferably, the computer 2 controls the gradient pulse 24A, which has a suitable peak amplitude, through the interface 2b to dephase the first MR signal 28. Alternatively, the computer 2 waits for a time interval which is less than or equal to $T_1$ but longer than $T_2$ between the application of the first RF pulse 18 and the application of the next RF pulse 20.

Then, at 40, the computer 2 controls the second RF pulse 20 of FIG. 2A through the interface 2b to provide the second predetermined flip-angle b of suitable peak amplitude. The RF pulse 20 is applied after the first MR signal 28 is dephased. Next, at 42, the signal processor 4 measures a second value Q for input by the computer 2 through the interface 2b. The value Q is measured from at least a portion of the second MR information corresponding to the MR signal 30 of FIG. 2A. Depending upon the application, as discussed above in connection with 36, the value Q corresponds to one of a peak value, time sampled value, or averaged value of the second MR information.

At 44, the ratio R is determined by dividing the first value S by the second value Q. Then, at 46, the ratio R is employed to calculate the longitudinal spin relaxation time $T_1$ from Equation 4. Next, at 48, the computer 2 dephases (as discussed above in connection with 38) the second MR signal 30 before the subsequent RF pulse 18 is applied. Preferably, at 38 and 48, an alternating sequence of the gradient pulses (e.g., 24A,26A,24B,26B) is employed with different peak amplitudes. Finally, at 50, it is determined whether a subsequent iteration of steps 34,36,38,40,42,44, 46,48,50 is executed (e.g., for averaging or imaging) and, if so, execution resumes at 34. Otherwise, execution is complete and one or more values of the ratio R and/or one or more values of the longitudinal spin relaxation time $T_1$ are suitably employed for subsequent display and/or imaging and/or analysis.

It will be understood by those skilled in the art that a practical implementation of the calculation of images or values of R and/or $T_1$ therefrom, that because R is computed as a ratio of two signals, when a sample or voxel generates little or no signal, the quotient may result in a "divide by zero" singularity. This is avoided by applying a threshold test to the denominator and numerator of Equation 3 prior to each calculation. The threshold test is: if either S or Q are below a preset threshold signal intensity, then the value of R is set to zero (or some other suitable background level). The threshold signal intensity level is typically set as a low multiple of the MR noise level (e.g., 3–8 times the root-mean-square noise).

Figure 2B:
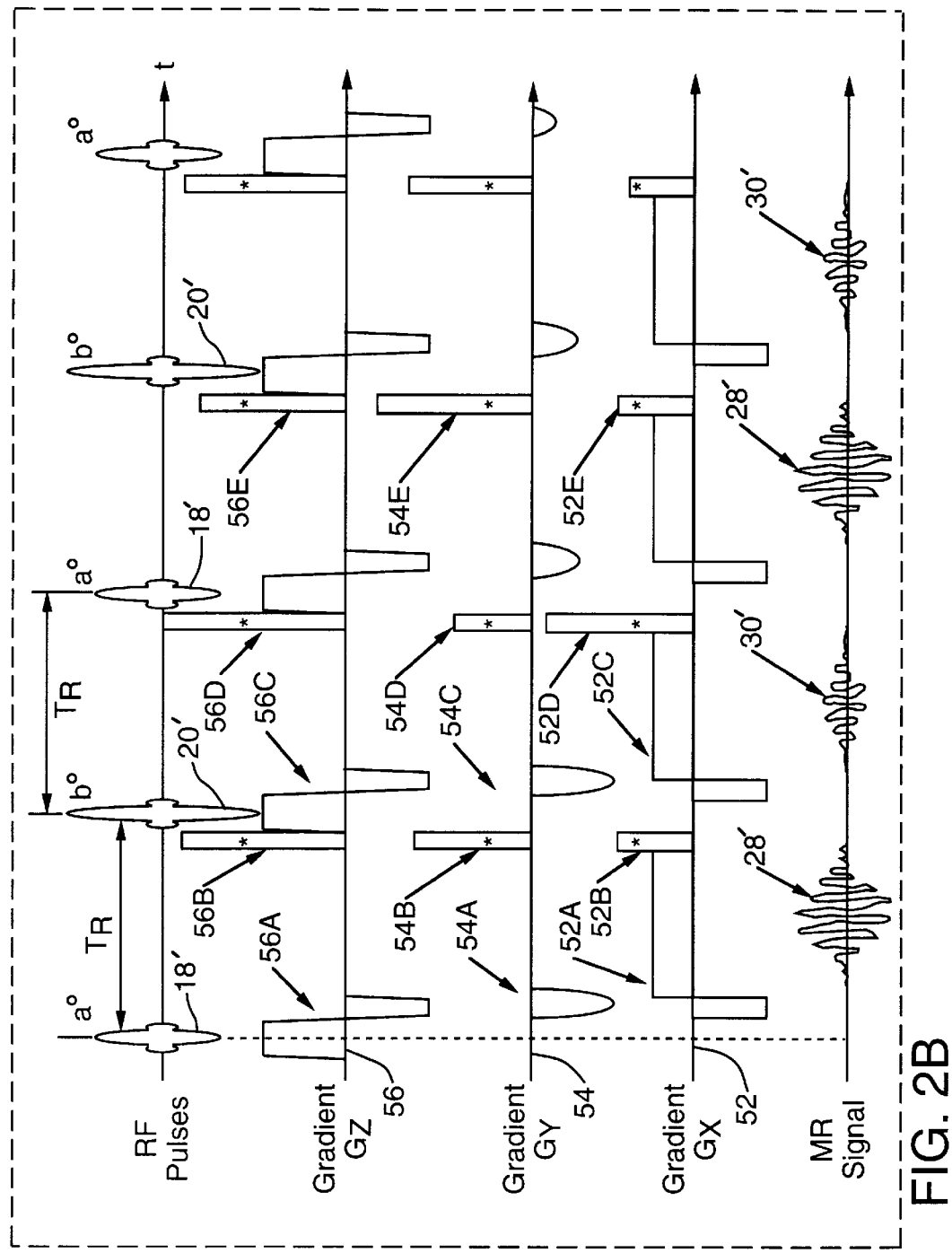
FIG. 2B is a plot of a slice selective MR imaging sequence including RF pulses having flip-angles a,b; three spatially encoded MR gradients; and resulting MR signals.

FIG. 2B illustrates a slice selective MR imaging sequence employing gradient refocused echoes for generating $T_1$ contrast enhanced images (i.e., images of R) or $T_1$ images. A plurality of first and second RF pulses 18',20' are employed to provide the flip-angles a and b as discussed above in connection with FIG. 2A.

Figure 5:
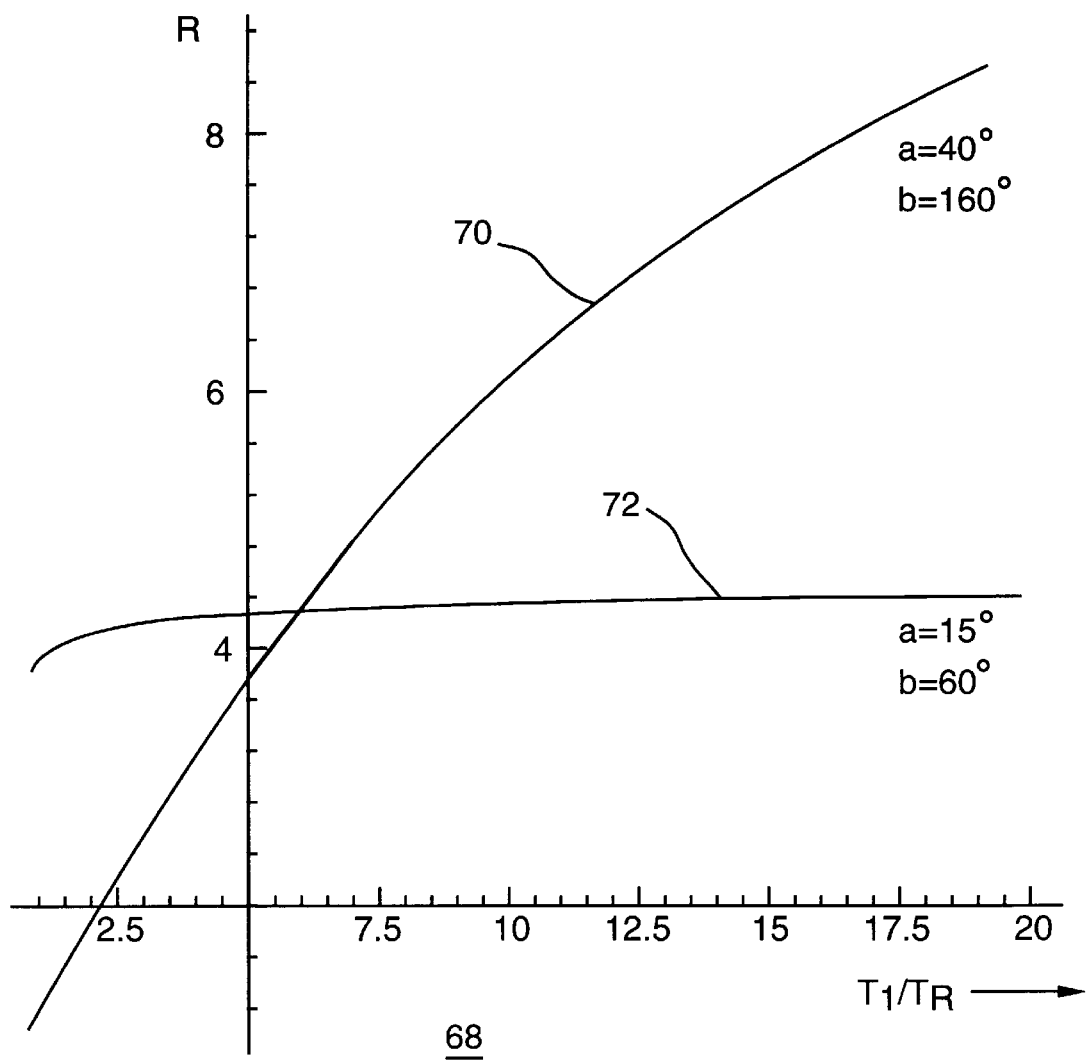
FIG. 5 is a plot of the ratio R of two MR signals in steady-state conditions for two pairs of flip-angles as a function of $T_1$ in units of $T_R$.

For imaging applications, the step of acquiring the MR signals 28',30' includes the provision of spatially encoding MR gradients 52,54,56. A $T_1$ image is calculated by applying Equation 4 to MR signals 28',30' (or portions thereof) derived from each pixel (or voxel) of the image. Alternatively, a ratio image, wherein each image pixel (or voxel) value is given by the value of R (i.e., first value S of MR signal 28' divided by second value Q of MR signal 30'), may be more easily calculated and is sensitive to $T_1$ (i.e., an image which substantially reflects longitudinal spin relaxation time contrast, for example, as shown in FIG. 5).

The a° and b° pulses of FIG. 2B are slice selective. Image acquisition commences after establishment of steady-state as discussed above in connection with FIG. 2A. The images are spatially encoded by the three gradients: (1) gradient $G_Z$ 56, slice selective; (2) gradient $G_Y$ 54, phase-encoding; and (3) gradient $G_X$ 52, read-out. The MR signals 28' and 30' excited by the a° pulse and the b° pulse, respectively, are acquired for each frame or voxel of the image.

The magnetic resonance gradients 52,54,56 are applied at least during the interval beginning when the first RF pulse 18' is applied to the end of acquisition of the MR signal 28', in order to spatially encode the corresponding first magnetic resonance information. Then, during the interval beginning when the second RF pulse 20' is applied to the end of acquisition of the MR signal 30', in order to spatially encode the corresponding second magnetic resonance information.

Figure 4:
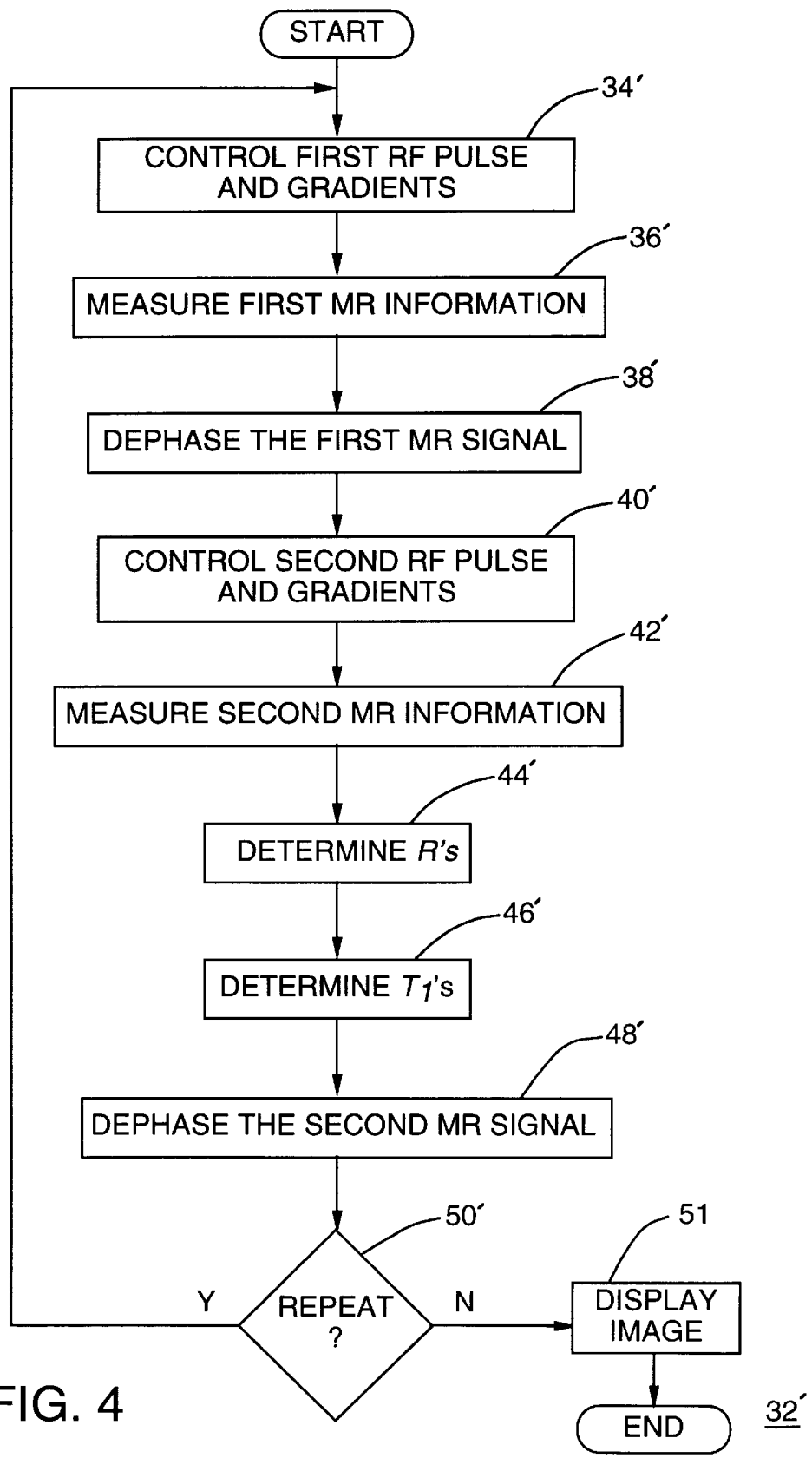
FIG. 4 is a flowchart of a software routine employed by the computer of FIG. 1 to determine longitudinal spin relaxation time contrast and/or longitudinal spin relaxation time $T_1$ for an image.

FIG. 4 is a flowchart of a software routine 32' employed by the computer 2 of FIG. 1 to determine longitudinal spin relaxation time contrast and/or the longitudinal spin relaxation time $T_1$ for an image. Beginning at 34', after steady-state has been established by repeated prior application of the sequence of alternate a and b pulses and gradients, the computer 2 controls a first RF pulse 18' of FIG. 2B through the interface 2b to provide the first predetermined flip-angle a of suitable peak amplitude. Also, the MR gradients 52,54,56 are spatially encoded as shown at 52A,54A,56A. Next, at 36', the signal processor 4 measures a set of first values S(i) for input by the computer 2 through the interface 2b. The values S(i) are measured from corresponding portions (e.g., at predetermined time intervals after the application of a first RF pulse 18') of the first MR information of the MR signal 28', of FIG. 2B. Then, at 38', the computer 2 dephases the first MR signal 28', before the subsequent RF pulse 20' is applied, by applying the "crusher" gradient pulses 52B,54B, 56B, each of which has a suitable peak amplitude, through the interface 2b. Alternatively, the computer 2 waits for a time interval which is less than or equal to $T_1$ but longer than $T_2$ between the application of the first RF pulse 18' and the application of the next RF pulse 20'.

Then, at 40', the computer 2 controls the second RF pulse 20' of FIG. 2B through the interface 2b to provide the second predetermined flip-angle b of suitable peak amplitude. The RF pulse 20' is applied after the first MR signal 28' is dephased. Also, the MR gradients 52,54,56 are spatially encoded as shown at 52C,54C,56C. Next, at 42', the signal processor 4 measures a set of second values Q(i) for input by the computer 2 through the interface 2b in a similar manner as discussed above in connection with 36'.

At 44', a set of ratios R(i) is determined by dividing each of the first values S(i) by the corresponding one of the second values Q(i). Then, at 46', the ratios R(i) are employed to calculate the longitudinal spin relaxation times $T_1(i)$ from Equation 4. Next, at 48', the computer 2 dephases (as discussed above in connection with 38') the second MR signal 30' before the subsequent RF pulse 18' is applied. Preferably, at 38' and 48', an alternating sequence of the gradient pulses (e.g., 56B-56D-56E, 54B-54D-54E, 52B-52D-52E) is employed with different peak amplitudes. Then, at 50', it is determined whether a subsequent iteration of steps 34',36',38',40',42',44', 46',48',50' is executed and, if so, execution resumes at 34'. Otherwise, at 51, the ratio values R(i) and/or the longitudinal spin relaxation time values $T_1(i)$ are suitably employed for imaging through the display 16 of FIG. 1. The R(i) and/or $T_1(i)$ values correspond to particular positions P(i) within a slice of the specimen as encoded by the three gradients 52,54,56.

Figure 2C:
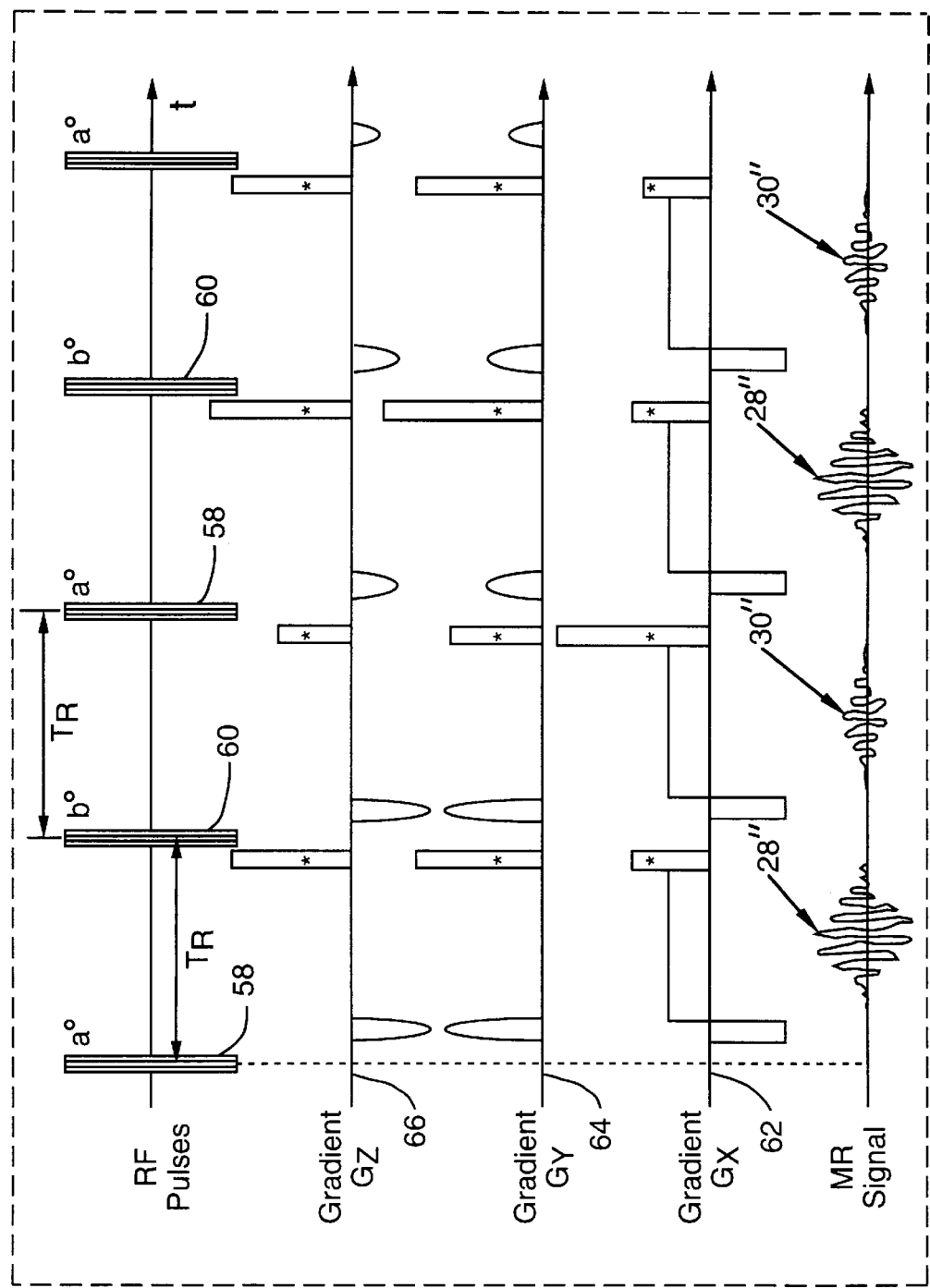
FIG. 2C is a plot of a three-dimensional imaging sequence including RF pulses, such as adiabatic BIRP or BIR-4 RF excitation pulses, having flip-angles a,b; three spatially encoded MR gradients; and resulting MR signals.

FIG. 2C illustrates a three-dimensional imaging sequence which may employ adiabatic BIRP or BIR-4 RF excitation pulses such as pulses 58,60. The slice-selection of FIG. 2B has been dropped and replaced by phase-encoding in the third dimension. The resulting images produced by the sequence of FIG. 2C are three-dimensionally encoded by the three gradients: (1) gradient $G_Z$ 66, phase-encoding; (2) gradient $G_Y$ 64, phase-encoding; and (3) gradient $G_X$ 62, read-out. It will be appreciated that the routine 32' of FIG. 4 may be employed by the computer 2 of FIG. 1 to apply the gradients 62,64,66 in place of the gradients 52,54,56, respectively, of FIG. 2B to produce a three-dimensional image of the specimen. Preferably, the intensities of the voxels of the image are proportional to the signal ratio R(i) which reflects the corresponding longitudinal spin relaxation times $T_1(i)$. Alternatively, a $T_1$ image may be calculated by applying Equation 4 to MR signals 28",30" (or portions thereof) derived from each voxel of the image.

Referring to FIG. 5, a plot 68 is illustrated of the ratio R of MR signals produced in a steady-state experiment as a function of $T_1$ in units of $T_R$ (i.e., $T_1/T_R$). Curve 70 is produced by flip-angles of a=40° and b=160°, and curve 72 is produced by flip-angles of a=15° and b=60°. The dependence of R on $T_1$, in units of $T_R$, is shown for the exemplary 40°,160° pair of curve 70. The monotonic, near-linear dependence of R on $T_1$ in curve 70 means that the ratio R itself is a relatively good indicator of $T_1$ contrast for a=40° and b=160°. In other words, an image of R (as distinct from an image calculated from Equation 4) will be highly sensitive to $T_1$ for a fixed value of $T_R$. Over a relatively large range of $T_1$, changes in R and images of R constructed therefrom, are a good measure of $T_1$ contrast. The 40°,160° pair of curve 70 also permits much better resolution of $T_1$ based on a known value of $T_R$ than the 15°,60° pair of curve 72.

As discussed above in connection with FIG. 2A, a variety of different pairs of flip-angles a,b are possible, although alternating 90°,180° pulses are avoided because the 180° pulse generates no signal and, hence, a ratio cannot be calculated. Also, as shown in curve 72 of FIG. 5, a 15°,60° pair produces a relatively poor sensitivity of R to $T_1$ variations.

Various applications of the method and apparatus of the invention are possible. One application is in an MR pulse sequence for conventional MR. This is suitable for determining $T_1$ times in bulk specimens. A second application is in MR imaging pulse sequences for MR imaging systems for displaying MR images with signal intensities exhibiting enhanced $T_1$ contrast. A third application is in MR imaging pulse sequences for MR imaging systems for relatively rapid determination of plural $T_1$ values, or displaying images whose intensity is directly proportional to the $T_1$ values.

Fourth and fifth applications utilize the existence of a proportional relationship between temperature or oxygen ($O_2$) concentration and $T_1$. To determine absolute temperature changes using $T_1$, additional calibration curves obtained, for example, by determining $T_1$ as a function of temperature in specimen tissues, are employed. As another example, calibration curves are employed if absolute tissue $O_2$ images are desired. However, in both of these examples, the absolute $O_2$/temperature information is typically less important than the observation of change per se (e.g., in cardiac stress-testing, or hyper- or hypo-thermy therapy) in which case the $T_1$ or R images suffice as images whose contrast is enhanced and sensitized to changes in these tissue properties.

Figure 6:
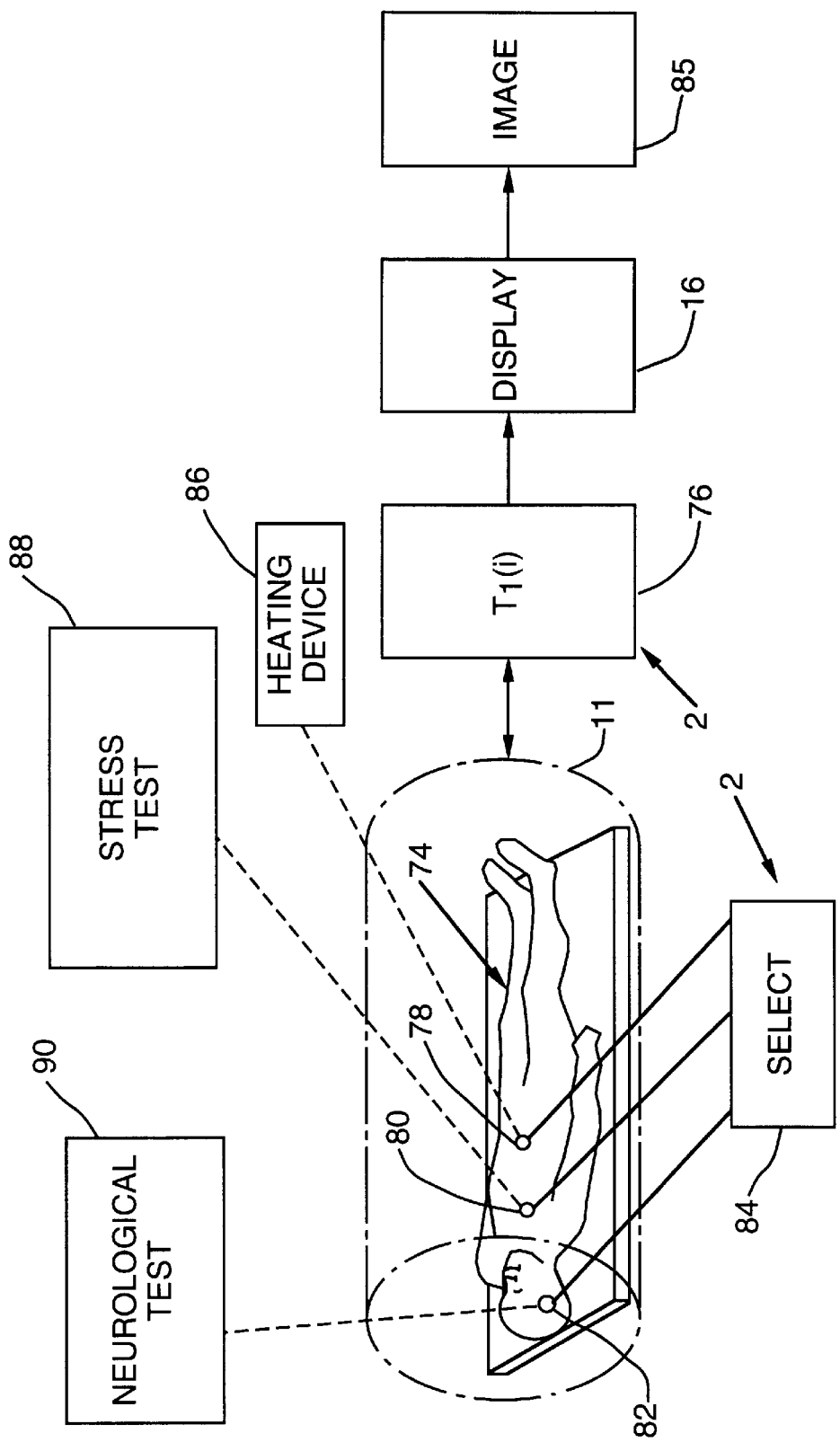
FIG. 6 is a block diagram of a MR imaging system to diagnose changes in a patient in accordance with the present invention.

As shown in FIG. 6, a patient 74 is employed as the specimen and the method and apparatus of the invention are employed to determine a plurality of longitudinal spin relaxation times $T_1(i)$ at 76 corresponding to one of various exemplary locations 78,80,82 within the patient 74 selected at 84. In turn, changes within the patient 74 are monitored from an image 85 formed by the computer 2 on the display 16 from the longitudinal spin relaxation times $T_1(i)$.

The fourth application results from the proportional relationship between $T_1$ and temperature in the specimen, and is useful in monitoring temperature changes in the specimen with an MR imaging system. These temperature changes are responsive, for example, to a heating device 86 which induces temperature changes within the patient 74 such as in human tissue at location 78. The heating device 86 may include at least one of hyperthermic cancer therapy, diathermy, ultrasound and laser devices with probe heads rendered compatible with the MR system by replacement of magnetic materials with otherwise equivalent non-magnetic components.

Continuing to refer to FIG. 6, the fifth application is for monitoring signal changes in the body which result from small changes in $T_1$ responsive to alterations in $O_2$ concentration or changes in blood perfusion in the patient 74. These alterations in $T_1$ may be brought about by physiologic functions such as, for example, stress in the heart 80 and/or neurological stimuli presented to the brain 82. For example, the patient 74 may be stimulated with at least one of a stress test 88 (e.g., isometric hand-grip or leg exercised aerobic exercise involving the limbs, pharmacologically induced stress) and neurological test 90 (e.g., visual, aural or touch stimuli, logical testing, pharmaceutical stimuli) before and/or during the monitoring of the changes within the patient 74. These changes, for example, may include changes in blood perfusion in the heart 80 of the patient 74 and/or changes in $O_2$ concentration in the brain 82 of the patient 74. It is believed that changes in image intensity or $T_1$ in the image 85 determined by the method and apparatus of the invention, before and/or during stimulus, will provide useful diagnostic information.

While for clarity of disclosure reference has been made herein to the exemplary display 16 for displaying an image, it will be appreciated that the image information may be stored, printed on hard copy, be computer modified, or be combined with other data. All such processing shall be deemed to fall within the terms "display" or "displaying" as employed herein.

Whereas particular embodiments of the present invention have been described above for purposes of illustration, it will be appreciated by those skilled in the art that numerous variations in the details may be made without departing from the invention as described in the appended claims.

I claim:

1. A method of determining magnetic resonance longitudinal spin relaxation time comprising the steps of:

establishing a main magnetic field with respect to a specimen;

employing a magnetic resonance excitation sequence of radio frequency pulses comprising a first radio frequency pulse followed by a second radio frequency pulse after a predetermined time interval;

employing the first radio frequency pulse having a first predetermined flip-angle;

employing the second radio frequency pulse having a second predetermined flip-angle which is different from the first predetermined flip-angle;

applying the first radio frequency pulse to the specimen to produce a first magnetic resonance signal;

dephasing the first magnetic resonance signal;

applying the second radio frequency pulse to the specimen to produce a second magnetic resonance signal;

dephasing the second magnetic resonance signal;

repeating, after said predetermined time interval, said applying the first radio frequency pulse, said dephasing the first magnetic resonance signal, said applying the second radio frequency pulse, and said dephasing the second magnetic resonance signal steps;

establishing a steady-state equilibrium of said first and second magnetic resonance signals;

acquiring first magnetic resonance information from at least the steady-state equilibrium of the first magnetic resonance signal corresponding to the first radio frequency pulse;

dephasing the first magnetic resonance signal;

acquiring second magnetic resonance information from at least the steady-state equilibrium of the second magnetic resonance signal corresponding to the second radio frequency pulse;

determining a ratio from said first and second magnetic resonance information; and determining the longitudinal spin relaxation time from said ratio.

2. The method of claim 1 including waiting for said predetermined time interval which is less than or about equal to the longitudinal spin relaxation time between the application of the first radio frequency pulse and the application of the second radio frequency pulse.

3. The method of claim 1 including applying the second radio frequency pulse of said applying the second radio frequency pulse step after the first magnetic resonance signal is dephased.

4. The method of claim 3 including employing a gradient pulse to dephase the first magnetic resonance signal.

5. The method of claim 3 including employing an alternating sequence of the first and second radio frequency pulses.

6. The method of claim 5 including establishing said steady-state equilibrium by employing said alternating sequence of the first and second radio frequency pulses prior to the steps of determining said ratio and determining said longitudinal spin relaxation time.

7. The method of claim 6 including repeating the steps of determining said ratio and determining said longitudinal spin relaxation time after repeating said alternating sequence of the first and second radio frequency pulses after establishing the steady-state equilibrium.

8. The method of claim 1 including employing a patient as the specimen;

determining a plurality of longitudinal spin relaxation times corresponding to a plurality of positions within the patient; and employing changes in the longitudinal spin relaxation times to monitor changes within the patient.

9. A method of imaging magnetic resonance longitudinal spin relaxation time comprising the steps of:

establishing a main magnetic field with respect to a specimen;

employing a magnetic resonance excitation sequence of radio frequency pulses comprising a first radio frequency pulse followed by a second radio frequency pulse after a predetermined time interval;

employing the first radio frequency pulse having a first predetermined flip-angle;

employing the second radio frequency pulse having a second predetermined flip-angle which is different from the first predetermined flip-angle;

applying the first radio frequency pulse to the specimen to produce a first magnetic resonance signal;

dephasing the first magnetic resonance signal;

applying the second radio frequency pulse to the specimen to produce a second magnetic resonance signal;

dephasing the second magnetic resonance signal;

repeating, after said predetermined time interval, said applying the first radio frequency pulse, said dephasing the first magnetic resonance signal, said applying the second radio frequency pulse, and said dephasing the second magnetic resonance signal steps;

establishing a steady-state equilibrium of said first and second magnetic resonance signals;

employing a plurality of magnetic resonance gradients to cause the steady-state equilibrium of said first and second magnetic resonance signals to become spatially encoded at at least one position within the specimen;

acquiring first magnetic resonance information from at least the spatially encoded steady-state equilibrium of the first magnetic resonance signal corresponding to the first radio frequency pulse;

dephasing the first magnetic resonance signal;

acquiring second magnetic resonance information from at least the spatially encoded steady-state equilibrium of the second magnetic resonance signal corresponding to the second radio frequency pulse;

dephasing the second magnetic resonance signal;

delivering said first and second magnetic resonance information to processing means;

determining the longitudinal spin relaxation time in said processing means from said first and second magnetic resonance information;

determining image information in said processing means on the basis of the longitudinal spin relaxation time corresponding to the position within said specimen from said first and second magnetic resonance information; and employing display means for receiving said image information from said processing means and displaying the same as an image.

10. The method of claim 9 including repeating the steps of employing said first and second radio frequency pulses to establish said steady-state equilibrium.

11. The method of claim 10 including employing a patient as the specimen;

employing the magnetic resonance gradients to define a plurality of positions within the patient; and determining a plurality of longitudinal spin relaxation times in said processing means corresponding to the positions within the patient.

12. The method of claim 11 including employing changes in the longitudinal spin relaxation times to monitor changes within the patient.

13. The method of claim 10 including measuring a first value from a portion of the first magnetic resonance information;

measuring a second value from a portion of the second magnetic resonance information which corresponds to the portion of the first magnetic resonance information;

applying a threshold test to said first and second values; and dividing the first value by the second value in said processing means to determine said ratio.

14. A method of producing images which substantially reflect magnetic resonance longitudinal spin relaxation time contrast comprising the steps of:

establishing a main magnetic field with respect to a specimen;

employing a magnetic resonance excitation sequence of radio frequency pulses comprising a first radio frequency pulse followed by a second radio frequency pulse after a predetermined time interval;

employing the first radio frequency pulse having a first predetermined flip-angle;

employing the second radio frequency pulse having a second predetermined flip-angle which is different from the first predetermined flip-angle;

applying the first radio frequency pulse to the specimen to produce a first magnetic resonance signal;

dephasing the first magnetic resonance signal;

applying the second radio frequency pulse to the specimen to produce a second magnetic resonance signal;

dephasing the second magnetic resonance signal;

repeating, after said predetermined time interval, said applying the first radio frequency pulse, said dephasing the first magnetic resonance signal, said applying the second radio frequency pulse, and said dephasing the second magnetic resonance signal steps;

establishing a steady-state equilibrium of said first and second magnetic resonance signals;

employing a plurality of magnetic resonance gradients to cause the steady-state equilibrium of said first and second magnetic resonance signals to become spatially encoded at at least one position within the specimen;

acquiring first magnetic resonance information from at least the spatially encoded steady-state equilibrium of the first magnetic resonance signal corresponding to the first radio frequency pulse;

dephasing the first magnetic resonance signal;

acquiring second magnetic resonance information from at least the spatially encoded steady-state equilibrium of the second magnetic resonance signal corresponding to the second radio frequency pulse;

dephasing the second magnetic resonance signal;

delivering said first and second magnetic resonance information to processing means;

determining a ratio from said first and second magnetic resonance information in said processing means;

determining image information in said processing means on the basis of the ratio corresponding to the position within said specimen; and employing display means for receiving said image information from said processing means and displaying the same as an image.

15. The method of claim 14 including repeating the steps of employing said first and second radio frequency pulses.

16. The method of claim 14 including measuring a first value from a portion of the first magnetic resonance information;

measuring a second value from a portion of the second magnetic resonance information which corresponds to the portion of the first magnetic resonance information;

applying a threshold test to said first and second values; and dividing the first value by the second value in said processing means to determine the ratio.

17. The method of claim 16 including determining a plurality of ratios in said processing means corresponding to a plurality of positions within the patient; and determining said image information in said processing means on the basis of the ratios corresponding to the positions within said specimen.

18. A method of determining magnetic resonance longitudinal spin relaxation time or imaging longitudinal spin relaxation time or producing images which substantially reflect longitudinal spin relaxation time contrast comprising the steps of:

establishing a main magnetic field with respect to a specimen;

employing a plurality of pairs of magnetic resonance excitation pulses including a first radio frequency pulse having a first predetermined flip-angle and a second radio frequency pulse having a second predetermined flip-angle which is different from the first predetermined flip-angle, with the first radio frequency pulse followed by the second radio frequency pulse after a predetermined time interval;

applying one of the first radio frequency pulses to the specimen to produce a corresponding first magnetic resonance signal;

dephasing said first magnetic resonance signal;

applying one of the second radio frequency pulses to the specimen after the first magnetic resonance signal is dephased to produce a corresponding second magnetic resonance signal;

dephasing said second magnetic resonance signal;

repeating, after said predetermined time interval, said applying one of the first radio frequency pulses, said dephasing said first magnetic resonance signal, said applying one of the second radio frequency pulses, and said dephasing said second magnetic resonance signal steps;

establishing a steady-state equilibrium of said first and second magnetic resonance signals;

employing a plurality of magnetic resonance gradients to cause the steady-state equilibrium of said first and second magnetic resonance signals to become spatially encoded within the specimen;

acquiring first magnetic resonance information from at least the spatially encoded steady-state equilibrium of the first magnetic resonance signal corresponding to said one of the first radio frequency pulses;

dephasing the first magnetic resonance signal;

acquiring second magnetic resonance information from at least the spatially encoded steady-state equilibrium of the second magnetic resonance signal corresponding to said one of the second radio frequency pulses;

dephasing the second magnetic resonance signal;

delivering said first and second magnetic resonance information to processing means; and determining a ratio from said first and second magnetic resonance information in said processing means.

19. The method of claim 18 including measuring a first value from a portion of the first magnetic resonance information;

measuring a second value from a portion of the second magnetic resonance information which corresponds to the portion of the first magnetic resonance information;

applying a threshold test to said first and second values; and dividing the first value by the second value in said processing means to determine said ratio.

20. The method of claim 19 including employing R as the ratio;

employing a as the first predetermined flip-angle;

employing b as the second predetermined flip-angle;

employing $T_R$ as said predetermined time interval between the application of said one of the first radio frequency pulses and the application of said one of the second radio frequency pulses; and calculating $T_1$ in said processing means as the longitudinal spin relaxation time from:

$$T_1 = -T_R / \ln\left(\frac{R\sin(a) - \sin(b)}{\cos(a)\sin(b) - R\cos(b)\sin(a)}\right)$$

21. The method of claim 20 including employing a of about 5° to 85° as the first predetermined flip-angle; and employing b of about 95° to 175° as the second predetermined flip-angle.

22. The method of claim 18 including repeating the steps of employing said first and second radio frequency pulses to establish said steady-state equilibrium.

23. The method of claim 18 including employing said method to determine the longitudinal spin relaxation time in the specimen.

24. The method of claim 23 including determining image information in said processing means on the basis of the longitudinal spin relaxation time corresponding to the position within said specimen; and employing display means for receiving said image information from said processing means and displaying the same as an image of the longitudinal spin relaxation time.

25. The method of claim 23 including determining image information in said processing means on the basis of the longitudinal spin relaxation time corresponding to the position within said specimen; and employing display means for receiving said image information from said processing means and displaying the same as an image having an intensity which is proportional to the longitudinal spin relaxation time.

26. The method of claim 23 including employing a patient as the specimen;

employing the magnetic resonance gradients to define a plurality of positions within the patient; and determining a plurality of longitudinal spin relaxation times in said processing means corresponding to the positions within the patient.

27. The method of claim 26 including employing changes in the longitudinal spin relaxation times to monitor changes within the patient.

28. The method of claim 27 including monitoring temperature changes as at least one of said changes within the patient.

29. The method of claim 28 including inducing temperature changes within the patient.

30. The method of claim 29 including employing at least one of hyperthermic cancer therapy, diathermy, ultrasound and laser means to induce said temperature changes within the patient.

31. The method of claim 27 including monitoring changes in blood perfusion as at least one of said changes within the patient.

32. The method of claim 27 including monitoring changes in $O_2$ concentration as at least one of said changes within the patient.

33. The method of claim 27 including stimulating the patient with at least one of work stress and neurological stimuli before or during the step of employing changes in the longitudinal spin relaxation times.

34. The method of claim 27 including stimulating the patient with a cardiac stress test; and monitoring changes of the heart of the patient as at least one of said changes within the patient.

35. The method of claim 27 including stimulating the patient with a neurological test; and monitoring changes of the brain of the patient as at least one of said changes within the patient.

36. The method of claim 18 including employing a plurality of magnetic resonance gradients to spatially encode a plurality of positions within the specimen.

37. An apparatus for determining longitudinal spin relaxation time or imaging longitudinal spin relaxation time or producing images which substantially reflect longitudinal spin relaxation time contrast comprising:

means for establishing a main magnetic field with respect to a specimen;

means for applying radio frequency pulses to the specimen to produce corresponding magnetic resonance signals;

means for dephasing the magnetic resonance signals;

means for acquiring magnetic resonance information from the magnetic resonance signals corresponding to the radio frequency pulses; and control means including (a) means for controlling the radio frequency pulses to provide a plurality of first radio frequency pulses having a first predetermined flip-angle and a plurality of second radio frequency pulses having a second predetermined flip-angle which is different from the first predetermined flip-angle, (b) means for applying a magnetic resonance excitation sequence of the radio frequency pulses comprising the first radio frequency pulses and the second radio frequency pulses, with one of the second radio frequency pulses following one of the first radio frequency pulses after a predetermined time interval, and with another one of the first radio frequency pulses following said one of the second radio frequency pulses after said predetermined time interval in order to establish a steady-state equilibrium of said first and second magnetic resonance signals, (c) means cooperating with said means for dephasing to dephase one of the first and second magnetic resonance signals before a subsequent one of the second and first radio frequency pulses, respectively, is applied, and (d) means for determining at least a ratio from first magnetic resonance information of the magnetic resonance signals corresponding to one of the first radio frequency pulses and second magnetic resonance information of the magnetic resonance signals corresponding to one of the second radio frequency pulses.

38. The apparatus of claim 37 including said means for controlling includes means for waiting for said time interval which is less than or about equal to the longitudinal spin relaxation time between the application of said one of the first radio frequency pulses and the application of said one of the second radio frequency pulses.

39. The apparatus of claim 37 including said means for controlling includes means for controlling the flip-angle of the first and second radio frequency pulses.

40. The apparatus of claim 37 including said means for determining at least a ratio includes means for determining the longitudinal spin relaxation time from the ratio.

41. The apparatus of claim 40 including said means for determining at least a ratio includes means for measuring a first value from at least a portion of the first magnetic resonance information, means for measuring a second value from at least a portion of the second magnetic resonance information which corresponds to the portion of the first magnetic resonance information; means for thresholding said first and second values; and means for dividing the first value by the second value to determine the ratio.

42. The apparatus of claim 41 including said means for measuring a first value and said means for measuring a second value include means for determining a peak value of said first and second magnetic resonance information, respectively.

43. The apparatus of claim 41 including said means for measuring a first value includes means for determining the first value from the first magnetic resonance information at said predetermined time interval after the application of said one of the first radio frequency pulses; and said means for measuring a second value includes means for determining the second value from the second magnetic resonance information at said predetermined time interval after the application of said one of the second radio frequency pulses.

44. The apparatus of claim 41 including said means for measuring a first value and said means for measuring a second value include means for averaging said first and second magnetic resonance information, respectively.

45. The apparatus of claim 37 including said means for dephasing includes means for applying gradient pulses to dephase the magnetic resonance signals.

46. The apparatus of claim 37 including said means for dephasing includes means for applying first gradient pulses to dephase the first magnetic resonance signals, and means for applying second gradient pulses to dephase the second magnetic resonance signals.

47. The apparatus of claim 46 including said means for dephasing includes means for varying the peak amplitude of the first gradient pulses and the peak amplitude of the second gradient pulses.

48. The apparatus of claim 47 including said means for varying the peak amplitude includes means for providing an alternating sequence of the first and second gradient pulses with different peak amplitudes.

49. The apparatus of claim 37 including said control means further includes means for displaying an image of the longitudinal spin relaxation time.

50. The apparatus of claim 37 including said control means further includes means for displaying an image which substantially reflects longitudinal spin relaxation time contrast.

51. The apparatus of claim 37 including said control means further includes means for displaying an image of a slice of the specimen.

52. The apparatus of claim 37 including said control means further includes means for displaying a three-dimensional image of the specimen.

53. The apparatus of claim 37 including said means for applying radio frequency pulses includes means for applying adiabatic BIRP or BIR-4 excitation pulses.

54. The apparatus of claim 37 wherein said means for dephasing includes means for spatially-encoding said first and second magnetic resonance signals.

* * * * *